(12) United States Patent
Tanaka et al.

(10) Patent No.: US 7,438,872 B2
(45) Date of Patent: Oct. 21, 2008

(54) STEAM OXIDATION APPARATUS

(75) Inventors: Yoshiyuki Tanaka, Kanagawa (JP);
Hironobu Narui, Kanagawa (JP);
Yoshinori Yamauchi, Kanagawa (JP);
Yoshiaki Watanabe, Kanagawa (JP);
Sadao Tanaka, Kanagawa (JP)

(73) Assignee: Sony Corporation (JP)

( * ) Notice: Subject to any disclaimer, the term of this patent is extended or adjusted under 35 U.S.C. 154(b) by 562 days.

(21) Appl. No.: 10/507,666

(22) PCT Filed: Dec. 26, 2003

(86) PCT No.: PCT/JP03/16869

§ 371 (c)(1),
(2), (4) Date: Sep. 15, 2004

(87) PCT Pub. No.: WO2004/066875

PCT Pub. Date: Aug. 5, 2004

(65) Prior Publication Data

US 2005/0208737 A1 Sep. 22, 2005

(30) Foreign Application Priority Data

Jan. 23, 2003 (JP) ............................. 2003-014260

(51) Int. Cl.
*B01J 19/00* (2006.01)
*C23C 16/00* (2006.01)

(52) U.S. Cl. .................... 422/198; 118/715; 118/724

(58) Field of Classification Search ................ 422/198, 422/180; 118/715, 724; 156/345.29, 345.33; 34/269, 274; 438/463, 708, 710–715, 770, 438/771, 773, 903

See application file for complete search history.

(56) References Cited

U.S. PATENT DOCUMENTS

| | | | | |
|---|---|---|---|---|
| 3,658,680 A | * | 4/1972 | Combe et al. | 204/206 |
| 5,139,999 A | * | 8/1992 | Gordon et al. | 427/252 |
| 5,431,733 A | * | 7/1995 | Shibuya et al. | 118/715 |
| 5,670,210 A | * | 9/1997 | Mandal et al. | 427/240 |
| 6,107,184 A | * | 8/2000 | Mandal et al. | 438/623 |

(Continued)

FOREIGN PATENT DOCUMENTS

JP 63-094634 4/1988

(Continued)

OTHER PUBLICATIONS

Translation of Yukio Komura, et al. JP-02190473.*

(Continued)

*Primary Examiner*—Walter D. Griffin
*Assistant Examiner*—Huy-Tram Nguyen
(74) *Attorney, Agent, or Firm*—Rader Fishman & Grauer PLLC; Ronald P. Kananen (57) ABSTRACT

A steam oxidation apparatus is provided which is capable of ensuring a desirable controllability and reproducibility of the steam oxidation of an object-to-be-oxidized housed in the reactor, by suppressing condensation of the steam in the steam-accompanied inert gas supplied to the reactor.

The steam oxidation apparatus 78 is an apparatus used for forming the current confinement structure into the surface-emitting laser element by subjecting the high-Al-content layer to steam oxidation, and is equipped with a reactor 42 for the steam oxidation, a steam-accompanied inert gas system for supplying a steam-accompanied inert gas to the reactor 42, an inert gas system for supplying an inert gas to the reactor 42, a reactor bypass pipe 52 for allowing the steam-accompanied inert gas system and inert gas system to bypass the reactor, and an exhaust system for discharging exhaust gas from the reactor 42. The steam oxidation apparatus 78 is further equipped with a thermostatic oven 72 which houses the $H_2O$ bubbler 60, second gas pipe 68, automatic open/close valves 66A to 66D, a portion of the third gas pipe 70 in the vicinity of the automatic open/close valves 66A to 66D, and a portion of the gas inlet port 42A side of the reactor 42.

8 Claims, 5 Drawing Sheets

U.S. PATENT DOCUMENTS

| | | | |
|---|---|---|---|
| 6,248,168 B1 * | 6/2001 | Takeshita et al. | 118/52 |
| 6,503,819 B2 * | 1/2003 | Tanabe et al. | 438/591 |
| 2005/0066893 A1 * | 3/2005 | Soininen | 118/715 |

FOREIGN PATENT DOCUMENTS

| | | | |
|---|---|---|---|
| JP | 02190473 A | * | 7/1990 |
| JP | 02-307892 | | 12/1990 |
| JP | 07-283543 A | | 10/1995 |
| JP | 08-241868 | | 9/1996 |
| JP | 09-148257 | | 6/1997 |
| JP | 09-148257 A | | 6/1997 |
| JP | 09148257 A | * | 6/1997 |
| JP | 09205066 A | * | 8/1997 |
| JP | 09-287075 | | 11/1997 |
| JP | 09-287075 A | | 11/1997 |
| JP | 10-050612 | | 2/1998 |
| JP | 10-144682 | | 5/1998 |
| JP | 10-144682 A | | 5/1998 |
| JP | 10144682 A | * | 5/1998 |
| JP | 11-204517 | | 7/1999 |
| JP | 2000-068260 | | 3/2000 |

OTHER PUBLICATIONS

International Search Report dated Apr. 13, 2004.

Y. Hayashi et al., Record low-threshold index-guided InGaAs/GaAIAs vertical-cavity surface-emitting laser with a native oxide confinement structure, Electronics Letters, Mar. 30, 1995, vol. 31, No. 7, pp. 560-562.

Japanese Office Action: Application No. 2003-014260; Date Issued: Aug. 14, 2007.

Japanese Office Action: Application No.: 2003-014260; Dated: Apr. 3, 2007.

* cited by examiner

PRIOR ART

FIG.5 PRIOR ART

STEAM OXIDATION APPARATUS

TECHNICAL FIELD

The present invention relates to a steam oxidation apparatus for treating an object-to-be-oxidized by steam oxidation, and more particularly to a steam oxidation apparatus capable of suppressing condensation of steam in an inert gas which is accompanied by the steam to be supplied to a reactor (referred to as steam-accompanied inert gas, hereinafter) during the steam oxidation.

BACKGROUND ART

Surface-emitting laser element is a semiconductor laser element capable of emitting laser light in the direction vertical to the surface of the substrate. As the surface-emitting laser element, a GaAs-base one, for example, has ever been developed, which comprises a pair of DBR (diffractive Bragg reflector) resonators formed on a semiconductor substrate such as GaAs, and composed of an AlGaAs/AlGaAs pair differed from each other in the Al composition, and an AlGaAs-base active layer disposed between the pair of DBR reflectors and serves as a light-emitting region.

In this type of surface-emitting layer element, it is necessary to restrict a sectional area of current path of current injected into the active layer, for the purpose of raising the emission efficiency and lowering the threshold current. In recent years, as a method of restricting the current path, a method of forming a current confinement structure is becoming a mainstream, in which a high-Al-content layer, typically an AlAs layer, is interlaced in a multi-layered film composing the DBR reflector, and only a portion of the high-Al-content layer is selectively oxidized to thereby convert it into $Al_2O_3$ having a large electric resistance.

Figure 4:
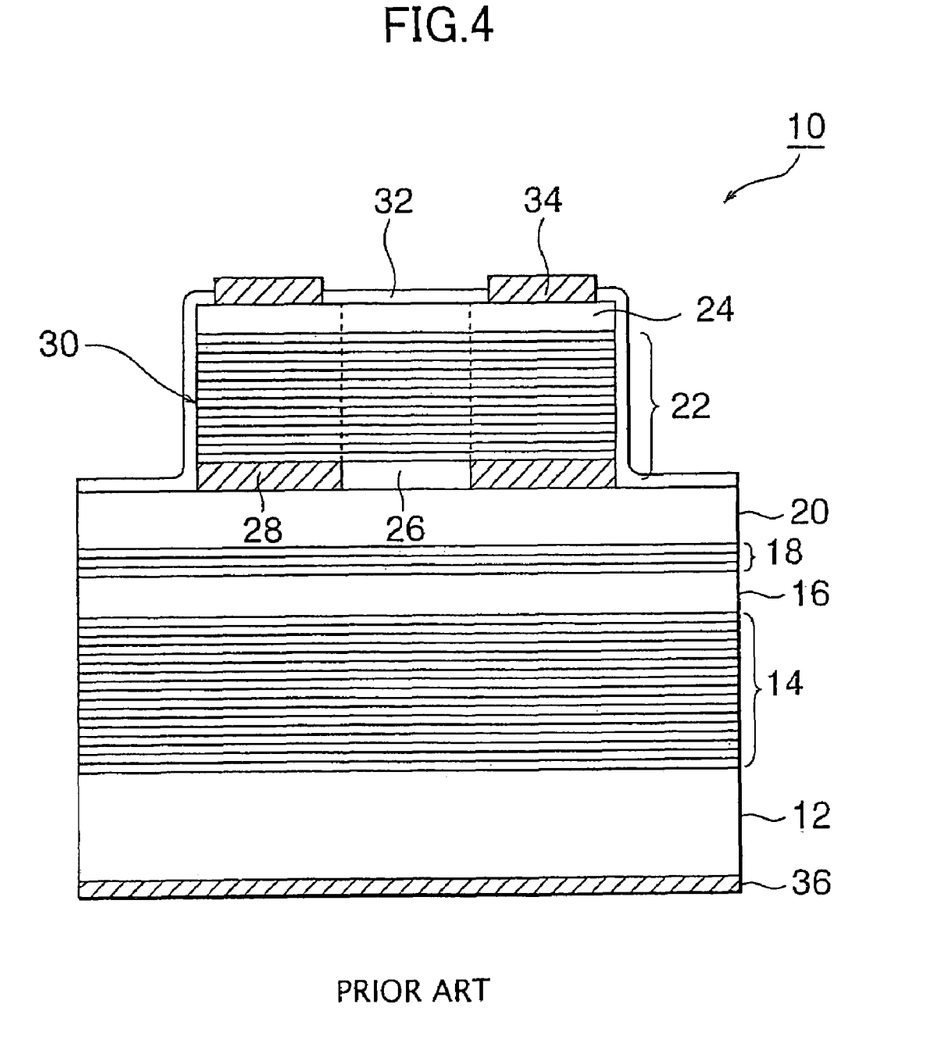
FIG. 4 is a sectional view showing an exemplary configuration of the surface-emitting laser element.

An exemplary configuration of a surface-emitting laser element having the current confinement structure obtained by oxidizing an AlAs layer will be explained referring to FIG. 4. FIG. 4 is a sectional view showing a configuration of the surface-emitting laser element.

The surface-emitting laser element 10 has, as shown in FIG. 4 and as being sequentially stacked on an n-type GaAs substrate 12, a stacked structure which comprises a lower DBR resonator 14 composed of an n-type semiconductor multi-layered film, an $Al_{0.3}Ga_{0.7}As$ lower cladding layer 16, an active layer 18, an $Al_{0.3}Ga_{0.7}As$ upper cladding layer 20, an upper DBR resonator 22 composed of a p-type semiconductor multi-layered film, and a p-type GaAs cap layer 24.

The lower DBR resonator 14 is configured as the semiconductor multi-layered film composed of 30.5 pairs of n-type $Al_{0.2}Ga_{0.8}As$ layers and n-type $Al_{0.9}Ga_{0.1}As$ layers.

The upper DBR resonator 22 is configured as the semiconductor multi-layered film composed of 25 pairs of p-type $Al_{0.2}Ga_{0.8}As$ layers and p-type $Al_{0.9}Ga_{0.1}As$ layers.

A compositional layer of the upper DBR resonator 22 closest to the active layer 18 is formed as a p-type AlAs layer 26 in place of the p-type $Al_{0.9}Ga_{0.1}As$ layer, wherein exclusive of the center circular region thereof, the peripheral AlAs layer is converted into an Al oxidized layer 28 by selective oxidation.

The Al oxidized layer 28 functions as a high-electric-resistance current confinement region of the oxidation confinement type. On the other hand, the center circular region remains intact as the p-type AlAs layer 26, and functions as a current injection region.

The cap layer 24 and the upper DBR resonator 22 are etched to form a columnar mesa post 30 having a circular section.

On the upper surface and side faces of the mesa post 30 and on the upper cladding layer 20 on both sides thereof, an $SiN_x$ film 32 is formed.

The $SiN_x$ film 32 on the upper surface of the mesa post 30 is removed in an annular form so as to allow the n-GaAs cap layer 24 to expose therein. An AuZn electrode having an almost same annular form is formed therein as a p-side electrode 34.

On the back surface of the n-type GaAs substrate 12, an AuGe/Ni/Au film is formed as an n-side electrode 36.

In fabrication of the surface-emitting laser element 10, first a stacked structure is formed on the n-type GaAs substrate 12 by sequentially stacking the lower DBR resonator 14, lower cladding layer 16, active layer 18, upper cladding layer 20, upper DBR resonator 22, and cap layer 24. Next, an $SiN_x$ film (not shown) is formed on the cap layer 24 by the plasma CVD process, and further thereon, a photoresist film (not shown) is formed.

Next, a circular pattern is transferred onto the photoresist film by a photolithographic technique to thereby form a circular etching resist mask (not shown), and then using the resist mask, the $SiN_x$ film is etched by the reactive ion etching (RIE) process using a $CF_4$ gas as an etching gas, to thereby form an $SiN_x$ mask.

Next, using the double-layered mask of the resist mask and $SiN_x$ mask, the cap layer 24 and upper DBR resonator 22 are etched to reach the upper cladding layer 20 by the reactive ion beam etching (RIBE) process using a chlorine gas, to thereby form the columnar mesa post 30.

Next, the stacked structure including the mesa post 30 is heated in a steam atmosphere to 350° C. to 450° C. so as to proceed oxidation until a desired diameter of oxidation confinement is obtained.

By this process, the p-type AlAs layer 26 in the upper DBR resonator 22 is oxidized selectively in a region which falls in the outer circumferential area of the mesa post 30, and thereby the Al oxidized layer 28 is formed, while leaving the center region of the mesa post 30 intact as a p-type AlAs layer 26.

Next, the double-layered mask of $SiN_x$ mask and resist mask is completely removed by the RIE process, and an $SiN_x$ film 32 is formed again over the entire surface by the plasma CVD process.

Next, the $SiN_x$ film 32 on the upper surface of the mesa post 30 is removed in an annular pattern, and the p-side electrode 34 composed of an AuZn electrode and having an almost same annular pattern is formed. Further being undergone typically through a process of forming the n-side electrode 36 composed of an AuGe/Ni/Au film on the back surface of the n-type GaAs substrate 12, the surface-emitting laser element 10 is completed.

Figure 5:
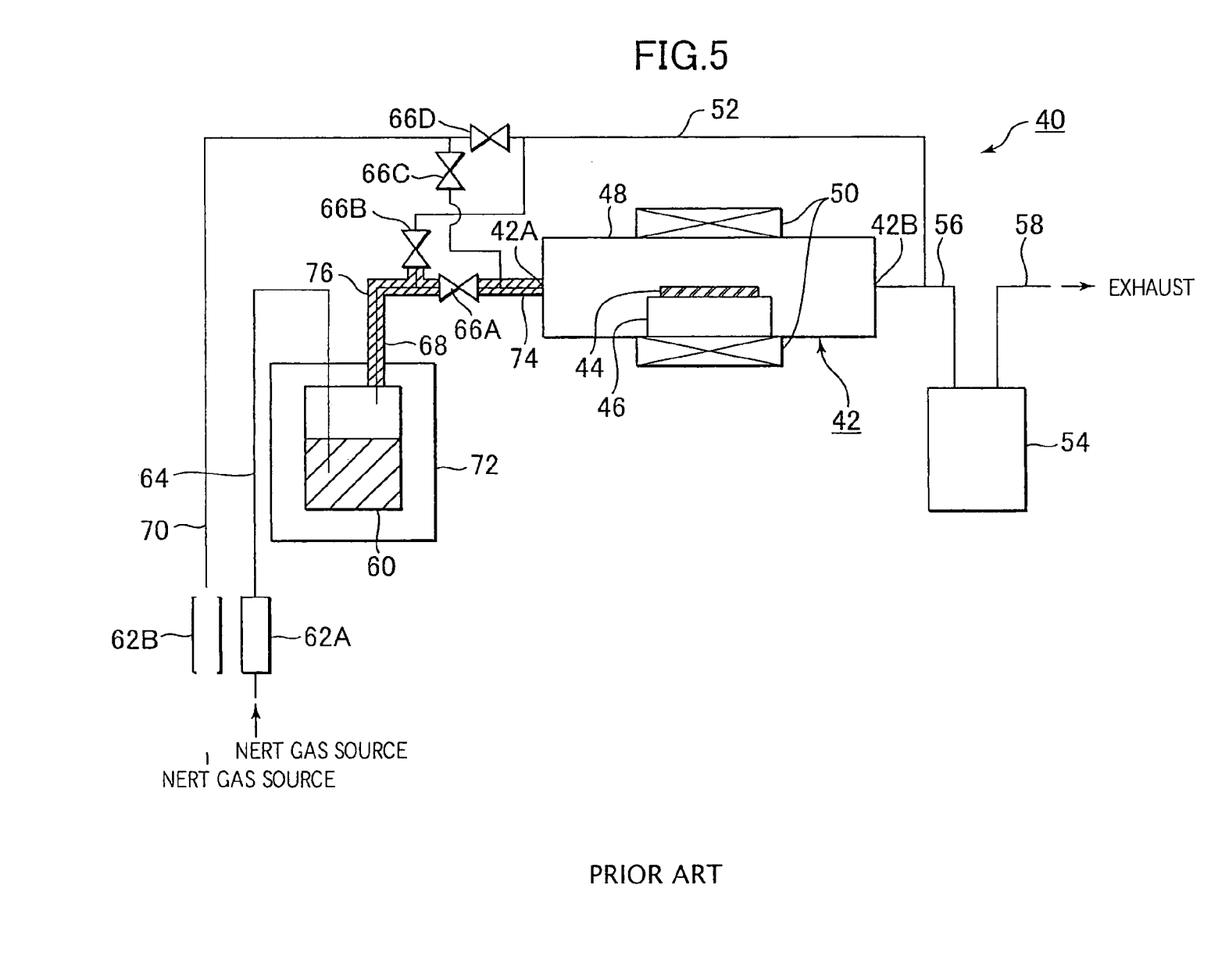
FIG. 5 is a flow sheet showing a configuration of a conventional steam oxidation apparatus.

Conventionally, the above-described steam oxidation of the AlAs layer 26 has been carried out using a steam oxidation apparatus as explained below. Next paragraphs will describe, referring to FIG. 5, a configuration of a conventional steam oxidation apparatus used for forming the oxidation-confinement-type current confinement structure in the surface-emitting laser element, by oxidizing a high-Al-content layer. FIG. 5 is a flow sheet showing a configuration of a conventional steam oxidation apparatus 40.

The steam oxidation apparatus 40 is an apparatus used for forming the current confinement structure into the surface-emitting laser element by subjecting the high-Al-content layer to steam oxidation, and is equipped with, as shown in FIG. 5, a single-slice-processing reactor 42 as a reactor for the steam oxidation.

The reactor 42 comprises a square-tube type quartz chamber 48 for housing a susceptor 46 on which a semiconductor substrate 44 comprising the surface-emitting laser element 10 having the above-described mesa post 30 formed therein is placed, and an electric furnace 50 disposed around the prism-formed quartz chamber 48.

The electric furnace 50 is a lamp heater, and can elevate temperature of the semiconductor substrate 44 through lamp irradiation.

The steam oxidation apparatus 40 further comprises a steam-accompanied inert gas system for supplying a steam-accompanied inert gas to the reactor 42, an inert gas system for supplying an inert gas to the reactor 42, a reactor bypass pipe 52 for allowing the steam-accompanied inert gas system and inert gas system to bypass the reactor, and an exhaust system for discharging exhaust gas from the reactor 42.

The exhaust system has a water-cooled trap 54, and further comprises a fourth gas pipe for introducing gases sent from a gas outlet port 42B of the reactor 42 and from the reactor bypass pipe 52 into the water-cooled trap 54, and a fifth gas pipe 58 for discharging the gas after being passed through the water-cooled trap 54.

The steam-accompanied inert gas system comprises an $H_2O$ bubbler 60 which contains pure water, and configured so as to allow the inert gas to blow and bubble therein to thereby make water vapor accompany the inert gas, a first gas pipe 64 connected to an inert gas source and sends the inert gas after being regulated by an MFC (mass flow controller) 62A to the $H_2O$ bubbler 60 so as to allow it to bubble therein, and a second gas pipe 68 for sending the steam-accompanied inert gas generated in the $H_2O$ bubbler 60 through an automatic open/close valve 66A to a gas inlet port 42A of the reactor 42.

The inert gas system is connected to the inert gas source, and has a third gas pipe 70 for sending the inert gas after being regulated by the MFC 62B in the flow rate, through the automatic open/close valve 66C to the gas inlet port 42A of the reactor 42.

The reactor bypass pipe 52 is connected, at one end thereof, to the second gas pipe 68 through the automatic open/close valve 66B and also to the third gas pipe 70 through an automatic open/close valve 66D, and at the other end thereof, to a fourth gas pipe 56 so as to allow the steam-accompanied inert gas and inert gas to bypass the reactor.

The first to fifth gas pipes are those typically made of ¼ SUS, and the automatic open/close valves 66A to 66D are disposed closer to the $H_2O$ bubbler 60 and reactor 42.

The automatic open/close valves 66A to 66D are electro-magnetic diaphragm valves.

When the steam-accompanied inert gas fed from the steam-accompanied inert gas system is supplied to the reactor 42, the automatic open/close valve 66A is opened, and the automatic open/close valve 66B is closed. When the inert gas fed from the inert gas system is supplied to the reactor 42, the automatic open/close valve 66C is opened and the automatic open/close valve 66D is closed.

It is possible to send the steam-accompanied inert gas fed from the steam-accompanied inert gas system to the reactor bypass pipe 52, by closing the automatic open/close valve 66A and opening the automatic open/close valve 66B. It is also possible to send the inert gas fed from the inert gas system to the reactor bypass pipe 52, by closing the automatic open/close valve 66C and by opening the automatic open/close valve 66D.

The $H_2O$ bubbler 60 is housed in the thermostatic oven 72, and water in the $H_2O$ bubbler 60 is regulated at a predetermined temperature by the thermostatic oven 72.

A tape-formed heater 74 is wrapped around the second gas pipe 68 between the $H_2O$ bubbler 60 and reactor 42, so as to heat the second gas pipe 68 to 120° C. to 130° C. or around, to thereby suppress condensation of the steam in the steam-accompanied inert gas passed through the $H_2O$ bubbler 60.

To form the oxidation-confinement-type current confinement structure in the surface-emitting laser element 10 by oxidizing the AlAs layer 26 using the steam oxidation apparatus 40, first the inert gas in the inert gas system is supplied to the reactor 42, and the semiconductor substrate 44, that is, a stacked structure of the surface-emitting laser element 10 having the mesa post 30 formed therein, is heated to 350° C. to 450° C. or around using the electric furnace 50.

Next, in place of the inert gas, the steam-accompanied inert gas is supplied to the reactor 42, and is allowed it to stand for a predetermined duration of time.

The conventional steam oxidation apparatus 40 configured as described in the above can supply the steam-accompanied inert gas from the steam-accompanied inert gas system to the reactor 42, and can proceed the steam oxidation of the AlAs layer 26 of the surface-emitting laser element 10, while keeping temperature of the surface-emitting laser element 10 having the AlAs layer 26 thereon and the mesa post 30 formed thereon at a predetermined high temperature.

It is to be noted that the present inventors could not find any prior technical literatures disclosing configuration of the above-described steam oxidation apparatus 40, so that disclosure of information on the prior technical literatures will be omitted.

It is, however, practically difficult to wrap the tape-formed heater 74 uniformly around the gas pipes in the conventional steam oxidation apparatus 40, and non-uniform wrapping of the tape-formed heater 74 possibly occurs, for example, at a bent portion 76 of the second gas pipe 68 sometimes resulted in only an insufficient heating of that portion.

It has also been difficult to sufficiently heat the automatic open/close valves 66A, 66B using the tape-formed heater 74 due to their structures and shapes. In particular, the second gas pipe 68 in the vicinity of the gas inlet port 42A of the reactor 42 is difficult to be fully wrapped by the tape-formed heater 74, and this sometimes resulted in only an insufficient heating.

As a consequence, there was a problem in that the path of the steam-accompanied inert gas always had a portion which could not fully be heated, and this resulted in condensation of the steam in the steam-accompanied inert gas in that portion.

Any condensation of a portion of the steam in the steam-accompanied inert gas supplied to the reactor 42, in the oxidation of the high-Al-content layer of the surface-emitting laser element, may vary the amount of steam in the steam-accompanied inert gas and may consequently vary oxidation rate, and this makes it difficult to obtain the current confinement structure in a highly controllable and reproducible manner.

Although the forgoing paragraphs described the case where the AlAs layer 26 of the surface-emitting laser element 10 was treated by steam oxidation, the same problem will apply also to the steam oxidation apparatus in general in which an object-to-be-oxidized housed in the reactor is treated by steam oxidation.

It is therefore an object of the present invention to provide a steam oxidation apparatus capable of ensuring a desirable controllability and reproducibility of the steam oxidation of an object-to-be-oxidized housed in the reactor, by suppressing condensation of the steam in the steam-accompanied inert gas supplied to the reactor.

DISCLOSURE OF THE INVENTION

To solve the above-described subjects, the present inventors conceived an idea that the second gas pipe 68 between the $H_2O$ bubbler and reactor 42, automatic open/close valves 66A, 66B and so forth, which cannot readily be heated by a tape-formed heater and are causative of condensation of a part of steam contained in the steam-accompanied inert gas supplied to the reactor 42, will be housed in a thermostatic oven, so as to prevent them from lowering in the temperature and to keep the temperature not lower than the condensation temperature of the steam contained in the steam-accompanied inert gas, to thereby suppress variation in the amount of steam in the steam-accompanied inert gas supplied to the reactor 42, and finally completed the present invention after extensive experiment.

A steam oxidation apparatus of the present invention, proposed based on the above-described findings in order to achieve the above-described object, has a reactor for allowing steam oxidation reaction to proceed, so as to steam-oxidize an object-to-be-oxidized held therein, and is characterized by having:

a steam-accompanied inert gas system which comprises an $H_2O$ bubbler containing pure water, allowing an inert gas to blow and bubble in the contained pure water to thereby produce a steam-accompanied inert gas in which an inert gas is accompanied by steam; a first gas pipe for allowing the inert gas to blow into the $H_2O$ bubbler at a predetermined flow rate; and a second gas pipe for sending the steam-accompanied inert gas through a first automatic open/close valve to a gas inlet port of the reactor; and an inert gas system having a third gas pipe for sending the inert gas at a predetermined flow rate through a second automatic open/close valve to a gas inlet port of the reactor;

wherein the $H_2O$ bubbler, the second gas pipe between the $H_2O$ bubbler and the gas inlet port of the reactor, and the first and second automatic open/close valves are housed in a thermostatic oven.

In the steam oxidation apparatus of the present invention, the $H_2O$ bubbler, the second gas pipe between the $H_2O$ bubbler and the gas inlet port of the reactor, and the first and second automatic open/close valves are housed in a thermostatic oven. This makes it possible to keep these components at a temperature not lower than the condensation temperature of steam in the steam-accompanied inert gas, to thereby suppress condensation of the steam in the steam-accompanied inert gas supplied to the reactor, and to suppress variation in the amount of steam in the steam-accompanied inert gas.

It is therefore possible to obtain a desirable controllability and reproducibility of steam oxidation of an object-to-be-oxidized held in the reactor, while keeping reaction conditions for the steam oxidation reaction constant.

In the present invention, further the third gas pipe in the vicinity of the second automatic open/close valve is preferably housed in the thermostatic oven. This successfully prevents the second automatic open/close valve and second gas pipe from being cooled due to heat conduction via the third gas pipe. This also makes it possible to heat the inert gas passing through the third gas pipe in the vicinity of the second automatic open/close valve, and consequently prevents the second automatic open/close valve and second gas pipe from being cooled by the inert gas supplied through the third gas pipe to the reactor, and is successful in obtaining the above-described effects.

The present invention is preferable enough to obtain the above-described effects if a portion of the gas inlet port side of the reactor is further housed in the thermostatic oven so as to fully heat the second gas pipe in the vicinity of the gas inlet port of the reactor.

The present invention is preferable enough to obtain the above-described effects if the thermostatic oven is a hot-air-circulating-type thermostatic oven.

In one preferable embodiment of the present invention, the object-to-be-oxidized is a stacked structural body having a high-Al content layer for fabricating a surface-emitting laser element, wherein the high-Al-content layer is treated by steam oxidation so as to form the oxidation-confinement-type current confinement structure in the surface-emitting laser element.

This makes it possible to form the oxidation-confinement-type current confinement structure in a highly controllable and reproducible manner.

The present invention is preferable enough to certainly prevent condensation of the steam in the steam-accompanied inert gas if the inner temperature of the thermostatic oven is set not lower than the condensation temperature of steam in the steam-accompanied inert gas. The temperature not higher than the boiling point of the pure water contained in the $H_2O$ bubbler is successful in preventing boiling of the pure water contained in the $H_2O$ bubbler.

BEST MODES FOR CARRYING OUT THE INVENTION

An embodiment of the present invention will specifically be detailed below, referring to exemplary modes of embodiment and attached drawings.

Exemplary Modes of Embodiment

Figure 1:
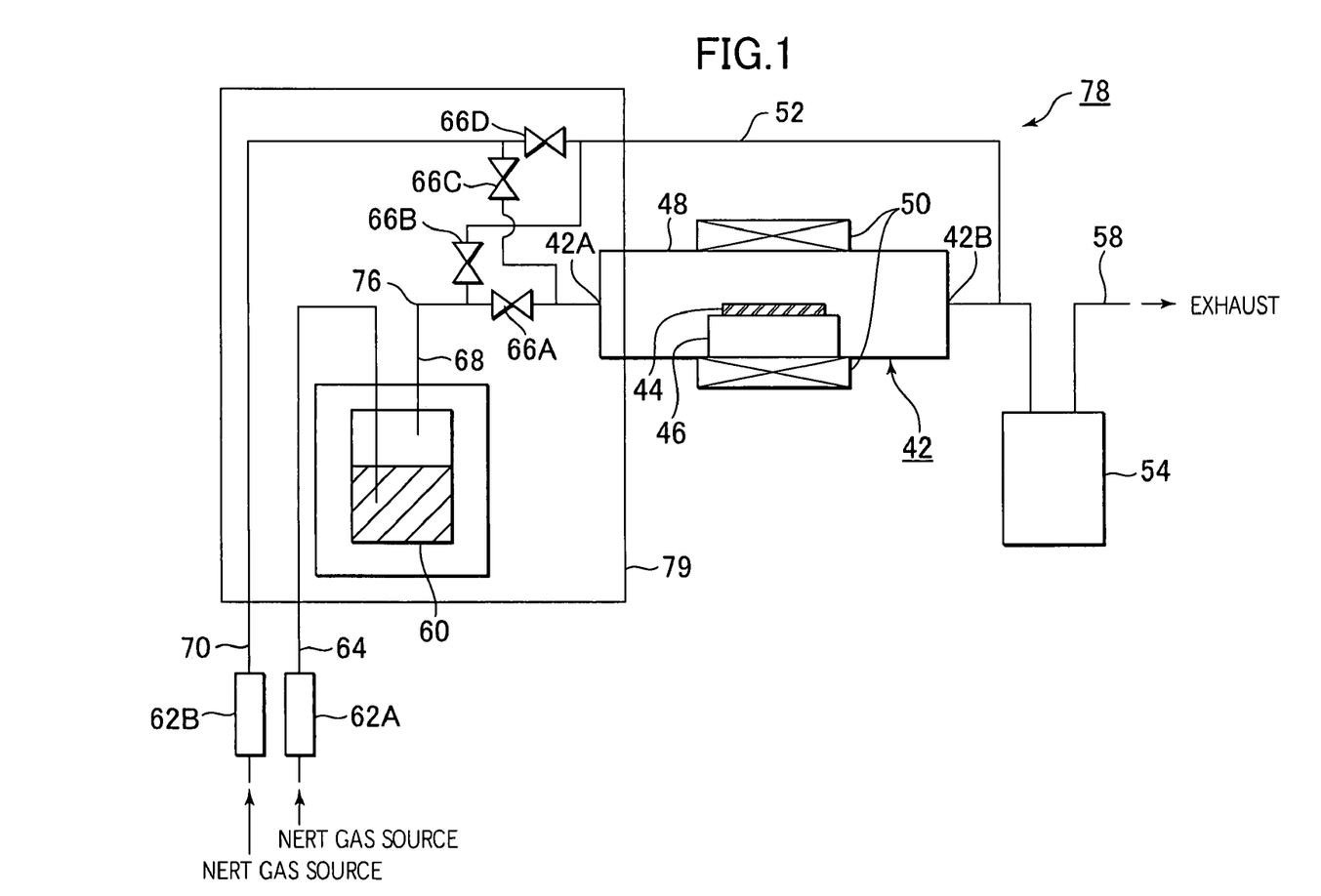
FIG. 1 is a flow sheet showing a configuration of a steam oxidation apparatus of one embodiment.

This exemplary mode of embodiment is an example of the steam oxidation apparatus of the present invention, and FIG. 1 is a flow sheet of the steam oxidation apparatus of this exemplary mode of embodiment.

As shown in FIG. 1, the steam oxidation apparatus 78 of this exemplary mode of embodiment has the same configuration as that of the conventional steam oxidation apparatus 40, except that it has, in place of the thermostatic oven 72 housing the $H_2O$ bubbler 60 of the conventional steam oxidation apparatus 40, a thermostatic oven 79 which houses the $H_2O$ bubbler 60, second gas pipe 68, automatic open/close valves 66A to 66D, a portion of the third gas pipe 70 in the vicinity of the automatic open/close valves 66A to 66D, and a portion of the gas inlet port 42A side of the reactor 42, and that the tape-formed heater 74 is not used.

Figure 2:
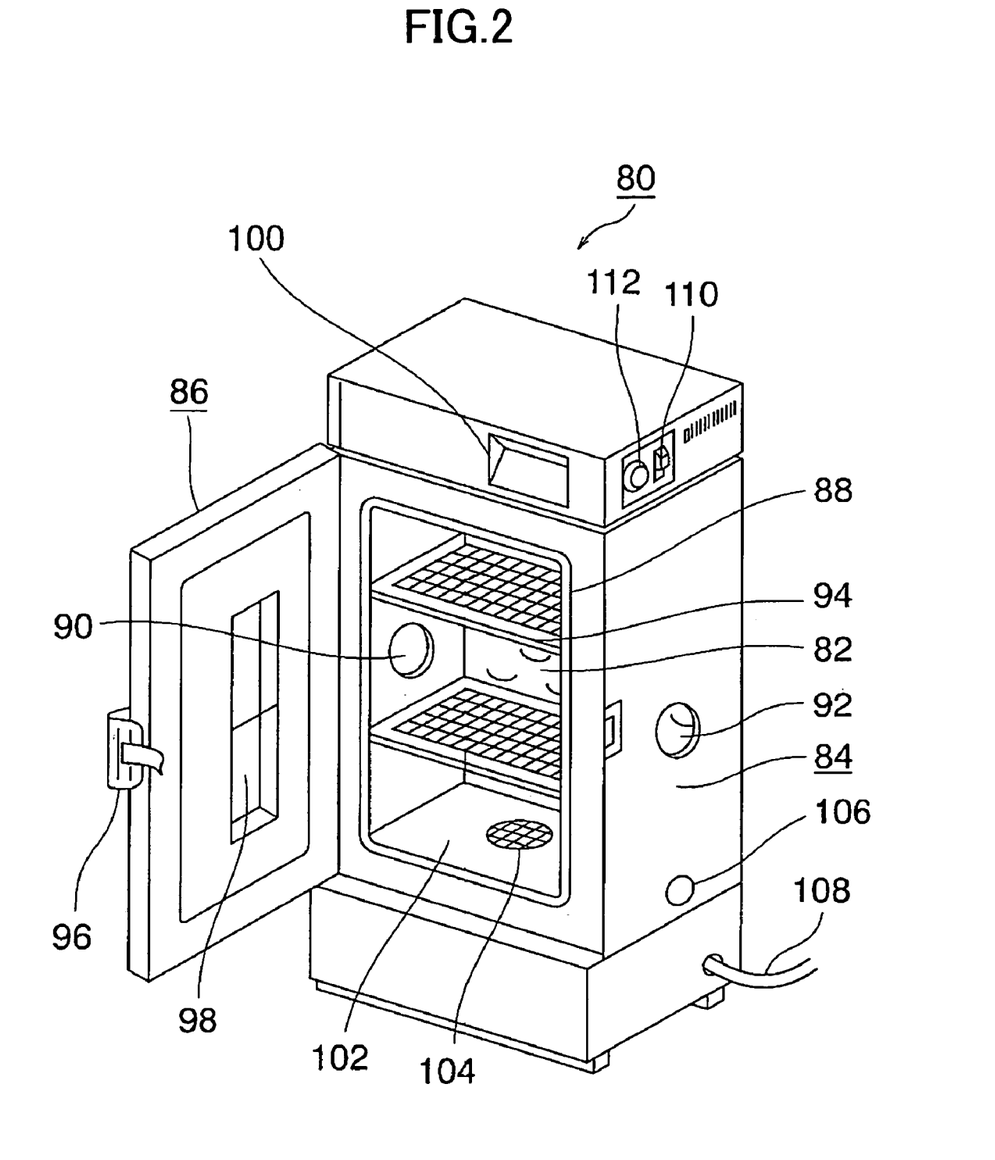
FIG. 2 is a perspective view showing an appearance of a thermostatic oven used for the steam oxidation apparatus of the embodiment.

In this exemplary mode of embodiment, as the thermostatic oven 79, a hot-air-circulating-type, constant-temperature thermostatic oven, which is typically thermostatic oven 80 as shown in FIG. 2, a product of Isuzu Seisakusho Co., Ltd. (trade name: Soyokaze Model ASF-115S), is used. A configuration of the thermostatic oven 80 will be explained referring to FIG. 2. FIG. 2 is a perspective view showing an appearance of the thermostatic oven 80 of the steam oxidation apparatus 78 according to this exemplary mode of embodiment.

The thermostatic oven 80 is a hot-air-circulation-type one in which the inner temperature of the oven is adjustable to a predetermined temperature within a range from 30° C. to 250° C., and comprises a main unit of the thermostatic oven having a thermostatic chamber isolated and heat-insulated from the external, a temperature control section for regulating temperature of the thermostatic chamber at a predetermined temperature, and a safety device for preventing overheating of the thermostatic chamber.

The main unit of the thermostatic oven has the thermostatic chamber 82 incorporated therein, and comprises a cabinet 84 kept under heating using a heat-insulating material and opened to the front, and a door 86 disposed on the front plane of the cabinet 84.

On the front surface of the cabinet 84, there is provided a packing 88 for improving air tightness and heat-insulating property of the thermostatic chamber 82 when the door 86 is closed, and on the left and right side panels of the cabinet 84, there are provided a left-side-panel hole 90 and a right-side-panel hole 92, respectively, for the convenience of introducing the gas pipes and so forth from the external into the thermostatic chamber 82.

The thermostatic chamber 82 is provided with a plurality of shelf plates 94 on which instruments or the like can be placed.

The door 86 can be swung leftward or rightward, and has a grip 96 used for opening/closing the door 86, and a double-glassed observation port 98 disposed at the center portion of the door 86.

The temperature control section comprises an operation panel 100 through which set temperature, set time and so forth are entered, a temperature sensor (not shown) for measuring temperature in the inner space of the thermostatic chamber 82, a heater 102 for heating the inner space of the thermostatic chamber 82 and for keeping the temperature therein at the set temperature, a fan 104 for keeping the inner space of the thermostatic chamber 82 at a uniform temperature by allowing the air to circulate therein, an exhaust damper 106 for maintaining pressure of the inner space of the thermostatic chamber 82 at normal pressure, and a power cord 108 for allowing power supply from a power source.

The safety device has a safety breaker 110 for disconnecting a power source of the heater 102, and an overheat preventive device 112 with a dial for setting an operating temperature of the safety breaker 110.

The first gas pipe 64 and third gas pipe 70 are passed through the left-side-panel hole 90 into the thermostatic chamber 82, and the $H_2O$ bubbler 60 and the automatic open/close valves 66A to 66D are attached typically on the shelf plate 94 or the like.

The reactor 42 is attached so as to space the electric furnace 50 by 3 cm or around from the right side panel of the thermostatic oven 80, and so that a portion of the gas inlet port 42A side thereof is inserted through the right-side-panel hole 92 into the thermostatic chamber 82. Also the reactor bypass pipe 52 is drawn out from the right-side-panel hole 92.

The left-side-panel hole 90 is tightly closed except for the portion through which the first gas pipe 64 and third gas pipe 70 are inserted, and the right-side-panel hole 92 is tightly closed except for the portion through which the reactor 42 and reactor bypass pipe 52 are inserted.

The automatic open/close valves 66A to 66D must be such as those durable to temperatures around 150° C.

Figure 3:
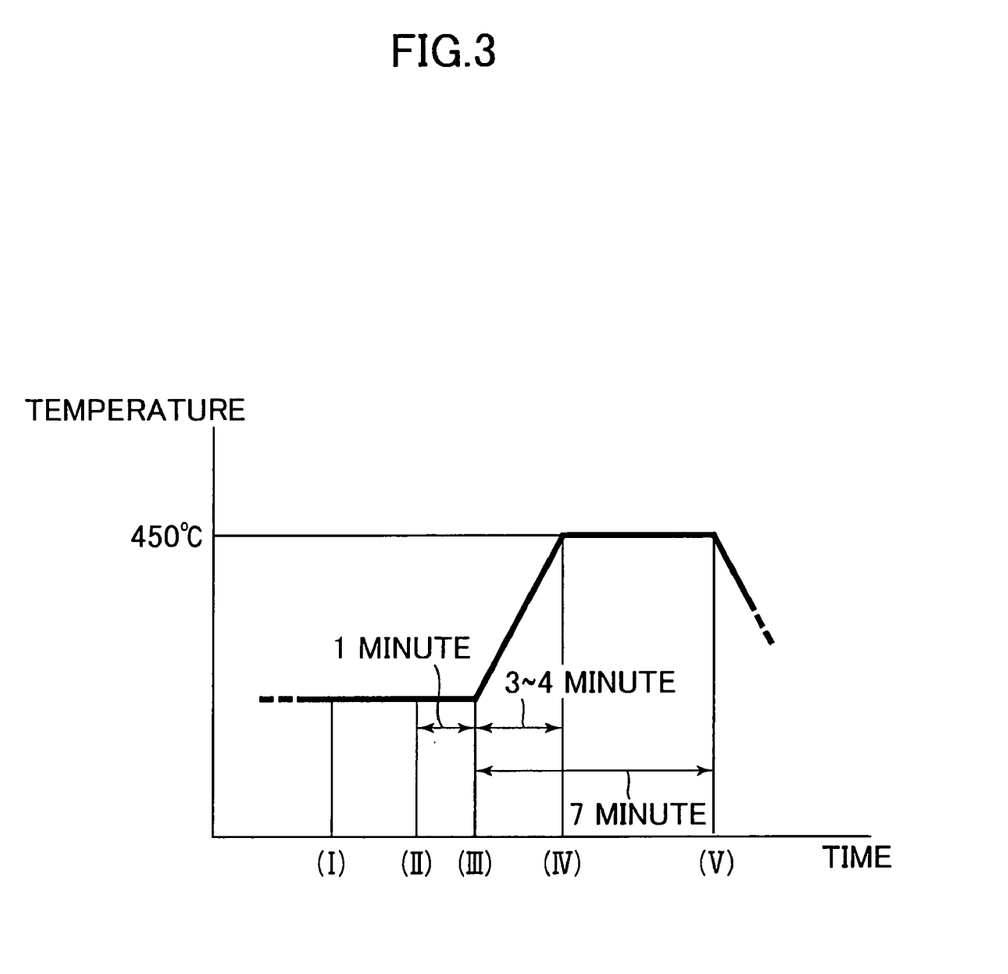
FIG. 3 is a time table showing a method of forming a current confinement structure in a surface-emitting laser element by treating an AlAs layer by steam oxidation using the steam oxidation apparatus of the embodiment.

A method of forming the oxidation-confinement-type current confinement structure into the surface-emitting laser element 10 by steam-oxidizing the AlAs layer 26 using the steam oxidation apparatus 78 of this exemplary mode of embodiment will be explained referring to FIG. 3. FIG. 3 is an exemplary time table in the process of steam-oxidizing the AlAs layer 26 to thereby form the oxidation-confinement-type current confinement structure into the surface-emitting laser element 10, wherein the abscissa plots time, and the ordinates plots temperature of the semiconductor substrate 44. In this exemplary mode of embodiment, $N_2$ gas was used as the inert gas.

First, at a point-in-time (i), flow rate of $N_2$ gas is adjusted to 4 slm by the MFC 62B, the automatic open/close valve 66D is closed, the automatic open/close valve 66C is opened, and $N_2$ gas is supplied to the reactor 42.

On the other hand, flow rate of $N_2$ gas is adjusted to 4 slm by the MFC 62A, the automatic open/close valve 66A is closed, and the automatic open/close valve 66B is opened. Temperature in the thermostatic chamber 82 is then set to a temperature not lower than the condensation temperature of steam in the steam-accompanied inert gas (referred to as steam-accompanied $N_2$ gas, hereinafter) using $N_2$ gas as the inert gas after reaching a steady state, and not higher than the boiling point of the pure water housed in the $H_2O$ bubbler, typically at 90° C., the bubbling is started in the $H_2O$ bubbler 60, and this state is held until a steady state of the steam-accompanied $N_2$ gas is reached.

Next, at a point-in-time (ii) where the steam-accompanied $N_2$ gas reached the steady state, the automatic open/close valve 66C is closed so as to terminate the $N_2$ gas supply, the automatic open/close valve 66B is closed, the automatic open/close valve 66A is opened so as to supply the steam-accompanied $N_2$ gas to the reactor 42, to thereby replace the inner atmosphere of the reactor 42 with the steam-accompanied $N_2$ gas.

Next, at a point-in-time (iii) one minute after the point-in-time (ii), the electric furnace 50 is activated. At a point-in-time (iv) approximately three to four minutes after the activation of the electric furnace 50, temperature of the semiconductor substrate 44, that is the temperature of the stacked structure of the surface-emitting laser element 10 having the mesa post 30 formed therein, reaches 450° C., and this proceeds the steam oxidation of the AlAs layer 26.

Seven minutes after the point-in-time (iii), the electric furnace 50 is inactivated, the automatic open/close valve 66B is closed so as to stop supply of the steam-accompanied $N_2$ gas, the automatic open/close valve 66C is opened so as to send $N_2$ gas into the reactor 42 and replace the inner atmosphere of the reactor with the $N_2$ gas, to thereby terminate the steam oxidation.

According to the steam oxidation apparatus 78 of this exemplary mode of embodiment, the $H_2O$ bubbler 60, the second gas pipe 68 between the $H_2O$ bubbler 60 and the gas inlet port 42A of the reactor 42, automatic open/close valves 66A to 66D, a portion of the third gas pipe 70 in the vicinity of the automatic open/close valves 66A to 66D, and a portion of the gas inlet port 42A side of the reactor 42 are housed in the thermostatic oven 72, so as to keep these components at a temperature not lower than the condensation temperature of the steam in the steam-accompanied $N_2$ gas, and this is successful in suppressing condensation of the steam in the steam-accompanied $N_2$ gas supplied through the $H_2O$ bubbler 60 to the reactor 42.

This suppresses variation in the amount of steam in the steam-accompanied $N_2$ gas supplied to the reactor 42, and makes it possible to form the current confinement structure in a highly controllable and reproductive manner in the steam oxidation of the AlAs layer 26 of the surface-emitting laser element 10.

INDUSTRIAL APPLICABILITY

In the steam oxidation apparatus of the present invention, the $H_2O$ bubbler, the second gas pipe between the $H_2O$ bubbler and the gas inlet port of the reactor, and the first and second automatic open/close valves are house in the thermostatic oven. This makes it possible to keep these components at a temperature not lower than the condensation temperature of steam contained in the steam-accompanied inert gas, to thereby suppress variation in the amount of steam in the steam-accompanied inert gas supplied to the reactor.

It is therefore possible to obtain a desirable controllability and reproducibility of steam oxidation of an object-to-be-oxidized held in the reactor, while keeping reaction conditions for the steam oxidation reaction constant.

The invention claimed is:

1. In a steam oxidation apparatus having a reactor for allowing steam oxidation reaction to proceed, for steam-oxidizing an object-to-be-oxidized held therein, said steam oxidation apparatus characterized by having:
   a steam-accompanied inert gas system which comprises an $H_2O$ bubbler containing pure water, allowing an inert gas to blow and bubble in said contained pure water to thereby produce a steam-accompanied inert gas in which an inert gas is accompanied by steam; a first gas pipe for allowing an inert gas to blow into said $H_2O$ bubbler at a predetermined flow rate; and a second gas pipe for sending said steam-accompanied inert gas through a first automatic open/close valve to a gas inlet port of the reactor; and
   an inert gas system having a third gas pipe for sending an inert gas at a predetermined flow rate through a second automatic open/close valve to a gas inlet port of the reactor;
   wherein said $H_2O$ bubbler, said second gas pipe between said $H_2O$ bubbler and said gas inlet port of the reactor, and said first and second automatic open/close valves are housed in a thermostatic oven wherein an inner temperature of said thermostatic oven is set not lower than the condensation temperature of steam in said steam-accompanied inert gas, and not higher than the boiling point of said pure water contained in said $H_2O$ bubbler.

2. A steam oxidation apparatus according to claim 1, characterized in that:
   said third gas pipe in the vicinity of said second automatic open/close valve is housed in said thermostatic oven.

3. A steam oxidation apparatus according to claims 1 or 2, characterized in that:
   a portion of said gas inlet port side of said reactor is further housed in said thermostatic oven.

4. A steam oxidation apparatus according to claims 1 or 2, characterized in that:
   said object-to-be-oxidized is a stacked structural body having a high-Al content layer for fabricating a surface-emitting laser element,
   wherein said high-Al-content layer is treated by steam oxidation so as to form an oxidation-confinement type current confinement structure in said surface-emitting laser element.

5. A steam oxidation apparatus according to claim 3, characterized in that:
   said object-to-be-oxidized is a stacked structural body having a high-Al content layer for fabricating a surface-emitting laser element,
   wherein said high-Al-content layer is treated by steam oxidation so as to form an oxidation-confinement type current confinement structure in said surface- emitting laser element.

6. In a steam oxidation apparatus having a reactor for allowing steam oxidation reaction to proceed, for steam-oxidizing an object-to-be-oxidized held therein, said steam oxidation apparatus characterized by having:
   a steam-accompanied inert gas system which comprises an $H_2O$ bubbler containing pure water, allowing an inert gas to blow and bubble in said contained pure water to thereby produce a steam-accompanied inert gas in which an inert gas is accompanied by steam; a first gas pipe for allowing an inert gas to blow into said $H_2O$ bubbler at a predetermined flow rate; and a second gas pipe for sending said steam-accompanied inert gas through a first automatic open/close valve to a gas inlet port of the reactor; and
   an inert gas system having a third gas pipe for sending an inert gas at a predetermined flow rate through a second automatic open/close valve to a gas inlet port of the reactor;
   wherein said $H_2O$ bubbler, said second gas pipe between said $H_2O$ bubbler and said gas inlet port of the reactor, and said first and second automatic open/close valves are housed in a thermostatic oven wherein an inner temperature of said thermostatic oven is set not lower than the condensation temperature of steam in said steam-accompanied inert gas, and not higher than the boiling point of said pure water contained in said $H_2O$ bubbler, and
   said thermostatic oven is a hot-air-circulating-type thermostatic oven.

7. A steam oxidation apparatus according to claim 6, characterized in that:
   a portion of said gas inlet port side of said reactor is further housed in said thermostatic oven.

8. A steam oxidation apparatus according to claim 6, characterized in that:
   said object-to-be-oxidized is a stacked structural body having a high-Al content layer for fabricating a surface-emitting laser element,
   wherein said high-Al-content layer is treated by steam oxidation so as to form an oxidation-confinement type current confinement structure in said surface-emitting laser element.

* * * * *